(12) United States Patent
Blatchford et al.

(10) Patent No.: US 9,899,364 B2
(45) Date of Patent: Feb. 20, 2018

(54) METHOD OF FORMING A TRANSISTOR WITH AN ACTIVE AREA LAYOUT HAVING BOTH WIDE AND NARROW AREA PORTIONS AND A GATE FORMED OVER THE INTERSECTION OF THE TWO

(71) Applicant: Texas Instruments Incorporated, Dallas, TX (US)

(72) Inventors: James Walter Blatchford, Richardson, TX (US); Thomas J. Aton, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 242 days.

(21) Appl. No.: 14/807,447

(22) Filed: Jul. 23, 2015

(65) Prior Publication Data

US 2015/0332974 A1    Nov. 19, 2015

Related U.S. Application Data

(62) Division of application No. 13/622,925, filed on Sep. 19, 2012, now Pat. No. 9,123,562.

(60) Provisional application No. 61/536,213, filed on Sep. 19, 2011.

(51) Int. Cl.
| | |
|---|---|
| *H01L 27/02* | (2006.01) |
| *H01L 21/8234* | (2006.01) |
| *H01L 27/088* | (2006.01) |
| *H01L 29/78* | (2006.01) |

(52) U.S. Cl.
CPC .. *H01L 27/0207* (2013.01); *H01L 21/823412* (2013.01); *H01L 21/823418* (2013.01); *H01L 21/823425* (2013.01); *H01L 21/823437* (2013.01); *H01L 27/088* (2013.01); *H01L 29/78* (2013.01); *H01L 2924/10157* (2013.01)

(58) Field of Classification Search
CPC ......... H01L 27/0207; H01L 21/823412; H01L 21/823418; H01L 21/823425; H01L 2924/10157
See application file for complete search history.

(56) References Cited

U.S. PATENT DOCUMENTS

| | | | |
|---|---|---|---|
| 5,654,915 A | 8/1997 | Stolmeijer et al. | |
| 6,184,588 B1 | 2/2001 | Kim et al. | |
| 7,484,197 B2 | 1/2009 | Allen et al. | |
| 8,552,509 B2 * | 10/2013 | Becker | H01L 27/0207 257/401 |
| 2002/0003270 A1 * | 1/2002 | Makino | H01L 27/088 257/390 |
| 2007/0218632 A1 | 9/2007 | Chung | |

(Continued)

*Primary Examiner* — Marcos D Pizarro
(74) *Attorney, Agent, or Firm* — Jacqueline J. Garner; Charles A. Brill; Frank D. Cimino (57) ABSTRACT

An integrated circuit with an active geometry with a wide active region and with a narrow active region with at least one jog where said wide active region transitions to said narrow active region and where a gate overlies said jog. A method of making an integrated circuit with an active geometry with a wide active region and with a narrow active region with at least one jog where said wide active region transitions to said narrow active region, where a gate overlies said jog and where a gate overlies the wide active region forming a wide transistor.

16 Claims, 6 Drawing Sheets

(56) References Cited

U.S. PATENT DOCUMENTS

2009/0032898 A1* 2/2009 Becker ................ G06F 17/5068
257/499
2010/0038684 A1 2/2010 Parikh et al.
2012/0032293 A1* 2/2012 Chen ................... H01L 27/0207
257/499

* cited by examiner

METHOD OF FORMING A TRANSISTOR WITH AN ACTIVE AREA LAYOUT HAVING BOTH WIDE AND NARROW AREA PORTIONS AND A GATE FORMED OVER THE INTERSECTION OF THE TWO

CROSS REFERENCE TO RELATED APPLICATIONS

This application is a divisional of U.S. Nonprovisional patent application Ser. No. 13/622,925, filed Sep. 19, 2012, and claims the priority of U.S. provisional application Ser. No. 61/536,213, filed Sep. 19, 2011, the contents of both of which are herein incorporated by reference in its entirety.

FIELD OF THE INVENTION

This invention relates to the field of integrated circuit fabrication methods. More particularly, this invention relates to the manufacture of semiconductor devices with different width transistors sharing a common active area.

BACKGROUND

Figure 1:
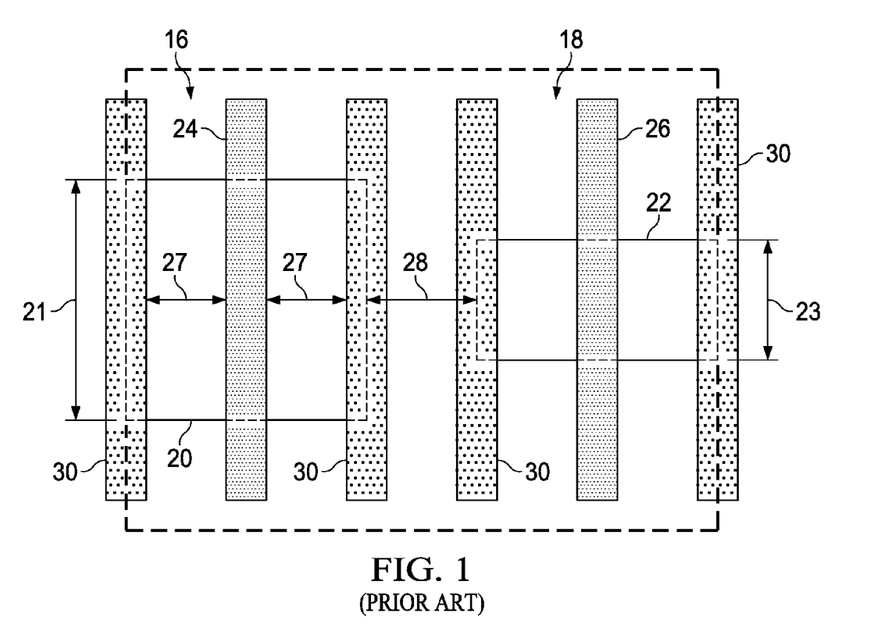
FIG. 1 (Prior art) shows two different width transistors whose active geometries are separated by shallow trench isolation FIGS. 2A and 2B (Prior art) are examples of different width transistors that share a common active geometry.
Figure 2A:
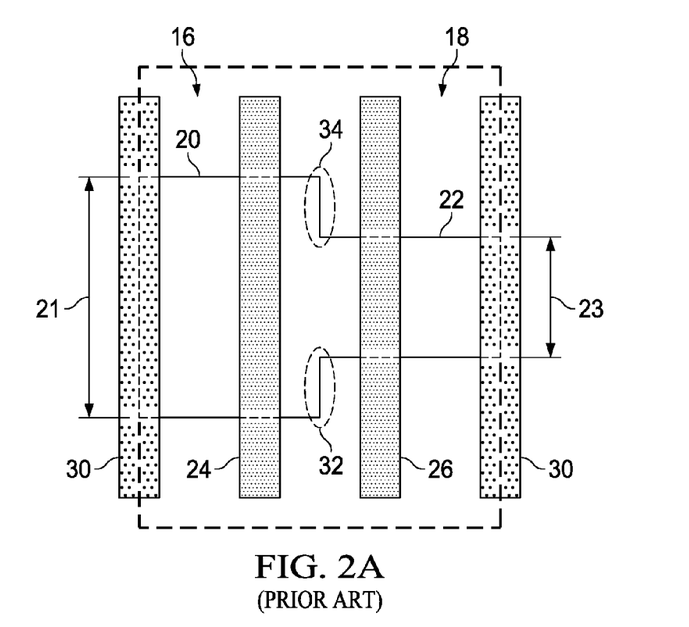
Figure 2B:
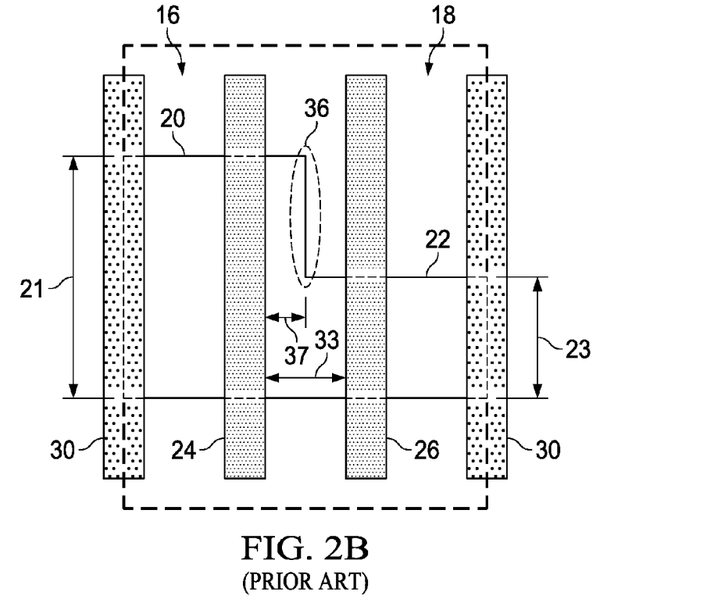

The active geometries of transistors may be joined together to eliminate the shallow trench isolation to reduce area and reduce cost in scaled-down technologies. For example two transistors, 16 and 18, with different transistor widths 21 and 23 as shown in FIG. 1 may be joined together as shown in FIGS. 2A and 2B. By joining the two active areas 20 and 22 together, the shallow trench isolation (STI) in dimension 28 may be eliminated significantly reducing the area of the two series transistors. Dummy gates 30 typically surround the transistor gates, 24 and 26, at a fixed pitch to improve patterning of the gates and also to control the profile of the gate during plasma etch.

In FIG. 2A two active jogs, 32 and 34, are formed in the active geometry where the wide transistor active transitions to the narrow transistor active.

In FIG. 2B one active jog, 36 is formed in the active geometry where the wide transistor active transitions to the narrow transistor active.

One problem with the transistor structure with joined active geometries is that the active area overlap of the wide transistor is no longer uniform across the width of the wide transistor. In FIG. 1, active area overlaps (e.g., 27) of the gate are of uniform width across the length of the transistor so series resistance due to the active areas is uniform. In FIG. 2B, the active area overlap 37 of the gate above the active jog 36 is significantly less than that active overlap 33 below the active jog 36. The narrow active width 37 may also result in poor silicide formation additionally increasing series resistance and degrading the transistor performance.

In scaled-down technologies, the close proximity of the jog to the gate of the wide transistor 26 has a pronounced impact on the channel width of the wide transistor due to photolithographic effects.

Figure 3:
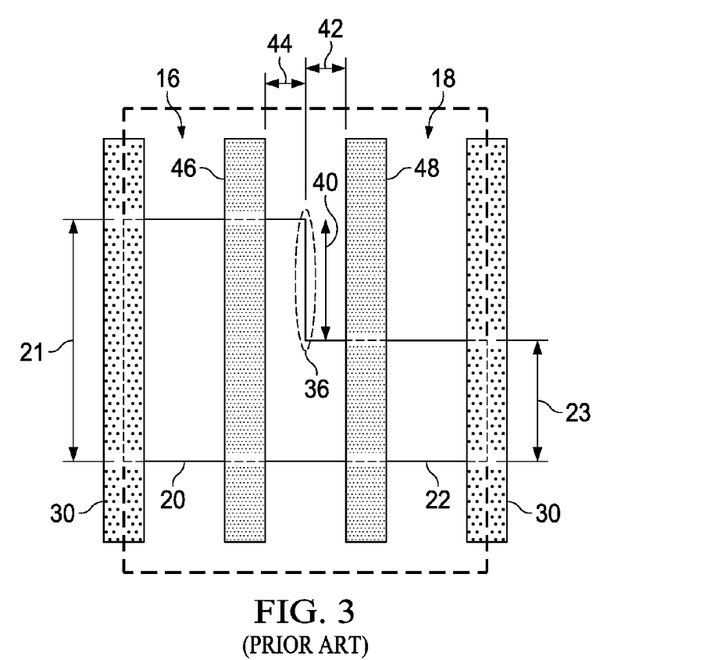
FIG. 3 (Prior art) is a top down view of a transistor structure with a wide transistor and a narrow transistor with connected active regions and with an active jog midway between the wide transistor and the narrow transistor.

In FIG. 3 the active jog is placed midway between the gate of the wide width transistor 46 and the gate of the narrow width transistor 48. The active overlap 44 of the wide transistor gate 46 is about equal to the active spacing 42 to the narrow width transistor gate 48.

Figure 5:
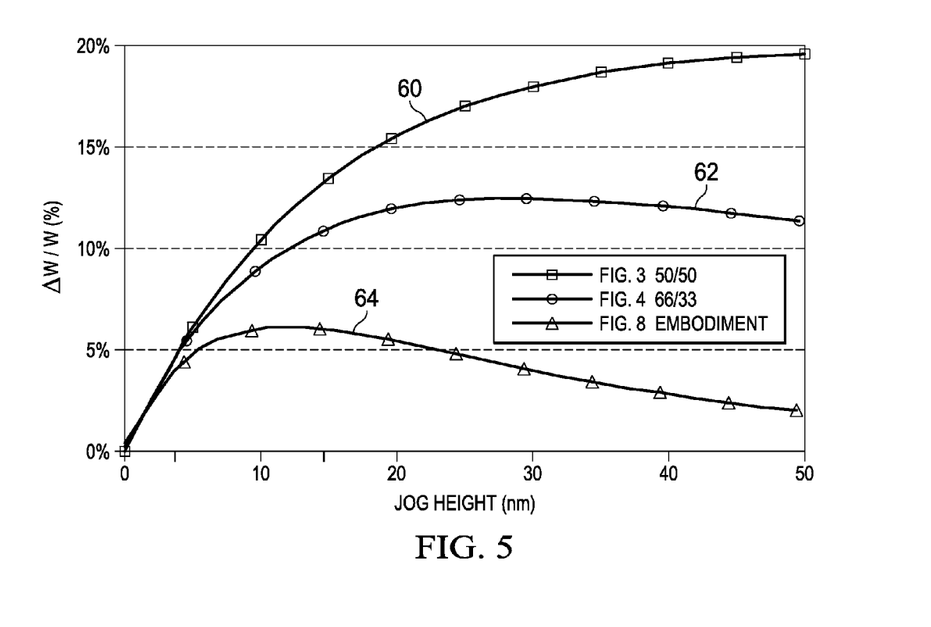
FIG. 5 is a graph of percentage change in effective wide transistor width versus jog height for conventional transistor structures and for an embodiment transistor structure.

The percentage change in channel width of the wide transistor 46 as a function of the jog height 40 is shown by plot 60 in FIG. 5. As is shown in the graph, when the jog height exceeds about 20 nm, the percentage change in transistor width do to lithographic effects exceeds about 15%. Typically circuit simulators do not take this variation into account. Not taking this much variation into account may cause the circuit to fail.

Figure 4:
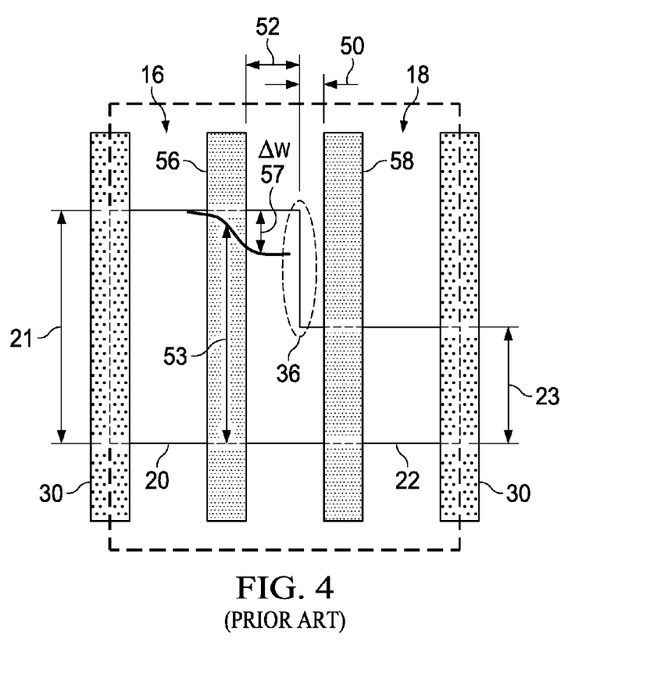
FIG. 4 (Prior art) is a top down view of a transistor structure with a wide transistor and a narrow transistor with connected active regions and with an active jog ⅔ the distance between the wide transistor and the narrow transistor.

To reduce the variation due to photolithographic effects and to reduce the difference in the active overhang of wide transistor gate above the jog and the active overhang of wide transistor gate below the jog, the jog may be placed midway between the wide and narrow transistor gates. Instead the jog may be moved closer to the narrow width transistor to increase the active overlap of wide width transistor gate as shown in FIG. 4. In FIG. 4, the active overhang 52 of wide transistor gate 56 is about double the active spacing 57 to the narrow transistor gate 58.

The percentage change (ΔW 57/W 53) in channel width 53 of the wide transistor 56 as a function of the jog height is shown by plot 62 in FIG. 5. As is shown in the graph, when the jog height exceeds about 20 nm, the change in transistor width do to lithographic effects exceeds about 11%. Typically circuit simulators do not take this variation into account. Not taking this much variation into account may cause the circuit to fail.

Scaled-down technologies often rely on strain engineering to boost the carrier mobility in the channel. Electron mobility in the channel of an NFET may be enhanced by applying tensile stress to the NFET channel and hole mobility in the channel of a PFET may be enhanced by applying compressive stress to the PFET channel.

For example, in the case of silicon substrates, p-channel field effect transistors (PFETS) are typically fabricated on substrates with a <100> crystallographic surface orientation. In <100> silicon the mobility of holes, which are the majority carriers in PFET can be increased by applying a compressive longitudinal stress to the channel. A compressive longitudinal stress is typically applied to the channel of a PFET by etching silicon from the source and drain regions and replacing it with epitaxially grown SiGe. Crystalline SiGe has a larger lattice constant than silicon and consequently causes deformation of the silicon matrix that, in turn, compresses the silicon in the channel region. Compression of the silicon lattice in the channel causes a separation of the light and heavy hole bands with a resulting enhancement of the low-field hole mobility. The increased hole mobility improves the PFET performance.

Figure 6:
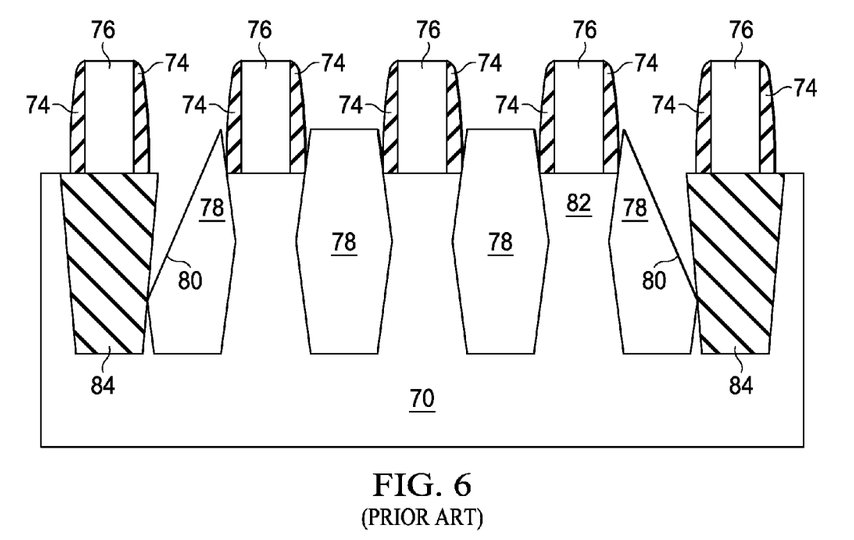
FIG. 6 (Prior Art) is a cross sectional view of PMOS transistors with epitaxial SiGe source and drains and with a SiGe/shallow trench dielectric interface.

Because the lattice constant of single crystal SiGe is larger than the lattice constant of single crystal Si, the SiGe is under significant compressive stress during epitaxial crystal growth. To minimize stress, it is thermodynamically favorable to form facets 80 as is shown in FIG. 6. These facets 80 typically are formed at the SiGe 78/STI 84 (shallow trench isolation dielectric) interface. These facets reduce the amount of SiGe next to the transistor channel region 82 and therefore reduce the stress applied to the channel of the transistor that lies beneath the transistor gate 76. Thus when facets 80 are formed the performance of the PFET is degraded. In addition, faceting may result in an increase in threading dislocations and an increase in diode leakage. The SiGe may be formed next to the transistor sidewalls 74 as shown in FIG. 6 or may be formed next to the transistor gate 76 prior to formation of the transistor sidewalls 74. Forming SiGe in closer proximity to the channel region increases the compressive stress applied to the channel.

Figure 7:
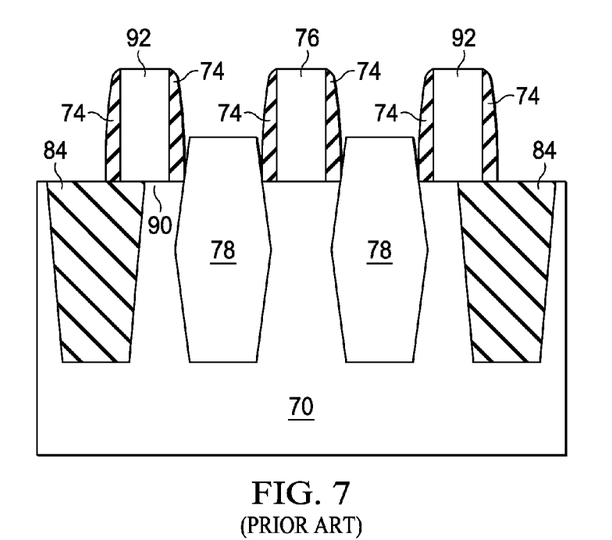
FIG. 7 (Prior Art) is a cross sectional view of PMOS transistors with epitaxial SiGe source and drains with no SiGe/shallow trench dielectric interface.

As shown in FIG. 7, one method of eliminating the SiGe/STI dielectric interface where faceting typically occurs is to form a dummy gate 92 overlying the STI dielectric/silicon interface. This prevents SiGe from coming into contact with the STI dielectric where faceting typically occurs.

Transistor structures with active jogs such as are shown in FIGS. 2A and 2B are especially problematic for PFETS with epitaxial SiGe stress enhancement and for NFETS with epitaxial SiC stress enhancement. Faceting which reduces stress enhancement decreasing transistor performance and increased threading dislocations which cause excessive diode leakage are commonly formed during epitaxial growth of SiGe or SiC next to jogs. Consequently design rules which forbid active jogs when stress enhancement is to be used are commonly used. These design rules result in increased transistor area and increased cost.

SUMMARY

An integrated circuit with an active area geometry with a wide active region and with a narrow active region with at least one jog where said wide active region transitions to said narrow active region and where a gate overlies said jog. A method of making an integrated circuit with an active geometry with a wide active region and with a narrow active region with at least one jog where said wide active region transitions to said narrow active region, where a gate overlies said jog and where a gate overlies the wide active region forming a wide transistor.

DETAILED DESCRIPTION OF EXAMPLE EMBODIMENTS

Embodiment transistor structures with different width transistors sharing a common active geometry are illustrated in FIGS. 8, 9, 10, and 11. Although only two transistors 118 and 120 with different widths are used to illustrate the embodiment transistor structures additional transistors with different width actives are also included in the embodiment.

Figure 8:
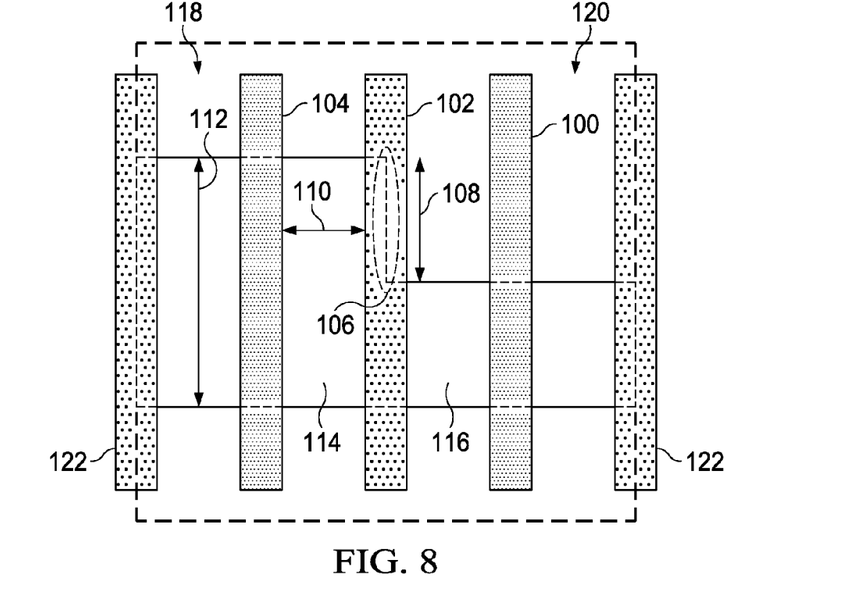
FIGS. 8, 9, 10, and 11 are top down views of embodiment transistor structures with a wide transistor and a narrow transistor circuit formed according to principles of the invention.

In FIG. 8 the jog 106 is formed under gate 102. Unlike the conventional transistor structure shown in FIGS. 3 and 4, the active overhang of the wide width transistor gate 104 has minimal impact on the width of the wide width transistor 104 due to photolithography. Plot 64 in FIG. 5 shows the percentage width variation of the wide transistor width as a function of jog height 108. The variation of the wide transistor width 112 vs jog height 108 for the embodiment transistor 104 structure in FIG. 8 is below 6%. When the jog height exceeds about 20 nm variation is below about 5%. Typically circuit simulators do not take this variation into account. The variation of the embodiment transistor structure is less than would be an issue for most conventional circuit simulators.

Another advantage of the embodiment transistor structure in FIG. 8 is that unlike the active overlap of wide width transistor gate in conventional transistor structures shown in FIG. 3 and FIG. 4 which is nonuniform above and below the jog, the active overlap 110 of the wide width transistor gate 104 is constant across the entire width 112 of the wide width transistor 104. This ensures a constant series resistance across the wide width transistor 104 and also facilitates formation of a uniform silicide across the entire active width 112 of the wide width transistor 104.

Yet another advantage of the embodiment transistor structure in FIG. 8 is that there are no active jogs in source or drain regions where epitaxial SiGe or SiC may be grown to enhance carrier mobility and transistor performance. With no active jogs in these active regions epitaxial SiGe or SiC may be grown without producing faceting and without producing excessive diode leakage due to threading dislocations.

The gate 102 which overlies the jog 106 in FIG. 8 may be connected to any appropriate fixed voltage to isolate narrow transistor 100 from wide transistor 104. Alternatively, gate 102 may be left unconnected (floating) or may be attached to a voltage appropriate to turn on transistor 102 so that the voltage of the active region 114 and active region 116 assume approximately the same voltage. Active areas 114 and 116 may also be shorted together using contacts and a layer of interconnect to have the same potential.

Figure 9:
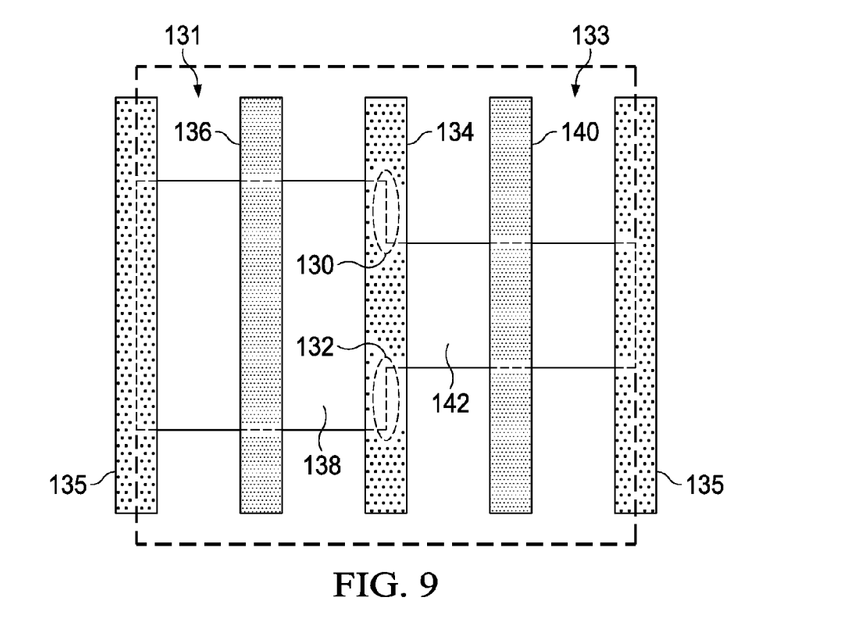

Another embodiment transistor structure is illustrated in FIG. 9. This embodiment is similar to the embodiment in FIG. 8 but with two active jogs 130 and 132 under gate 134. As with the embodiment transistor structure in FIG. 8 this embodiment has the advantages of significantly reduced dependence of the width of wide transistor 136 versus jog 132 and jog 134 height, constant series resistance and uniform silicide growth because active 138 has a constant width across wide transistor 136, and the ability to epitaxially grow SiGe or SiC in the active region 138 without faceting because of the lack of active jogs.

As with the embodiment transistor structure in FIG. 8, the gate 134 which covers the jogs 130 and 132 may be connected to any appropriate fixed voltage to isolate narrow transistor 140 from wide transistor 136. Alternatively, gate 134 may be left unconnected (floating) or may be attached to a voltage appropriate to turn on transistor 134 so that the voltage of the active region 138 and active region 142 may assume approximately the same voltage. Active areas 138 and 140 may also be shorted together using contacts and a layer of interconnect so they have the same potential.

Figure 10:
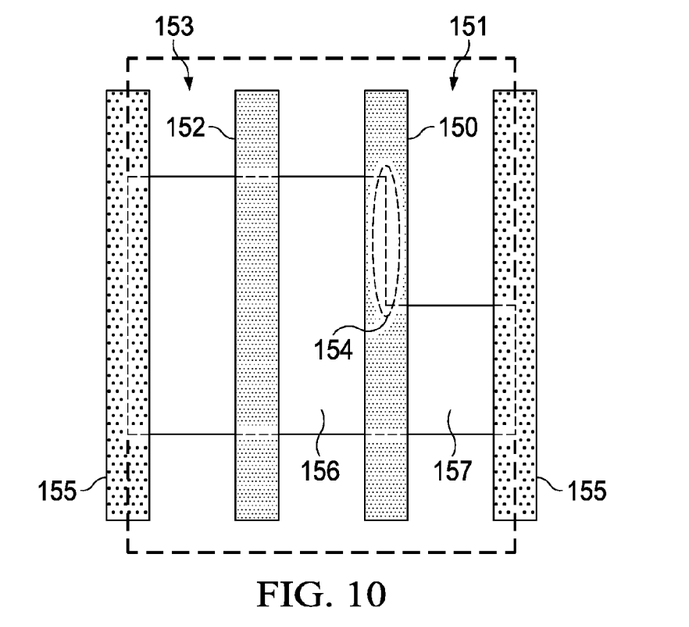

In the embodiment transistor structure shown in FIG. 10 transistor gate 150 over active jog 154 may be treated as an ordinary, driven, connected transistor. In this embodiment the wide transistor 152 is in series with the narrow width transistor formed by the gate 150 overlying the active jog 154. The drive strength of the transistor with the active jog for electrical simulation and other IC construction purposes may be determined experimentally or by other appropriate means known to those skilled in the art. Additional variability in drive strength due to misalignment between gate 150 and the active with the jog 154 may be included in the electrical simulation model.

Figure 11:
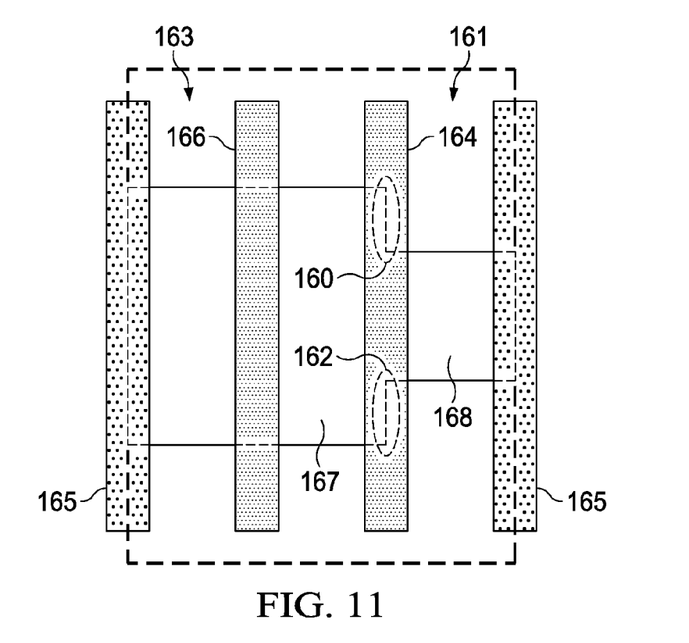

The embodiment transistor structure shown in FIG. 11 is similar to the embodiment transistor structure in FIG. 10 with two active jogs 160 and 162 instead of one. As with the embodiment structure in FIG. 10, transistor gate 164 over active jogs 160 and 162 may be treated as an ordinary, driven, connected transistor. In this embodiment the wide transistor 166 is in series with the narrow width transistor formed by the gate 164 overlying the active jogs 160 and 162. The drive strength of the transistor 164 with the active jogs, 160 and 162, may be determined for electrical simulation and other IC construction purposes experimentally or by other appropriate means known to those skilled in the art. Additional variability in drive strength due to misalignment between gate 164 and the active with jogs 160 and 162 may be included in the electrical simulation model.

Those skilled in the art to which this invention relates will appreciate that many other embodiments and variations are possible within the scope of the claimed invention.

What is claimed is:

1. A method of forming an integrated circuit, comprising:
   forming a first transistor with a gate over an active area;
   forming a second transistor with a gate over the active area, wherein a width of the active area in the first transistor is wider than a width of the active area in the second transistor, wherein the active area of the first transistors meets that active area of the second transistors at an active area jog; and
   forming a dummy gate over the active area jog between the gate of the first transistor and the gate of the second transistor, wherein the gate of the first transistor, the dummy gate, and the gate of the second transistor are disposed on a constant pitch.

2. The method of claim 1, wherein said first transistor is a PFET further comprising;
   epitaxially growing SiGe in a drain of said PFET.

3. The method of claim 1, wherein said first transistor is a NFET further comprising;
   epitaxially growing SiC in a drain of said NFET.

4. The method of claim 1, wherein said dummy gate is floating.

5. The method of claim 1, wherein said dummy gate is connected to a fixed voltage node.

6. The method of claim 1, wherein said dummy gate is connected to a signal node.

7. A method of forming an integrated circuit, comprising:
   forming an active geometry where a first portion of said active geometry has a first width, where a second portion of said active geometry has a second width, where said first width is wider than said second width and where there is at least one active jog where said first width transitions to said second width;
   forming a first gate over said jog; and
   forming a second gate over said first width to form a wide transistor.

8. The method of claim 7 further comprising:
   forming a first narrow transistor where said first gate is a transistor gate for said narrow transistor with said jog in a channel of said narrow transistor; and
   modifying a transistor model to include variation in said first narrow transistor caused by misalignment of said first gate to said jog.

9. The method of claim 7 further comprising:
   forming a third gate over said second width to form a narrow transistor.

10. The method of claim 7 where said wide transistor is a PFET further comprising;
    epitaxially growing SiGe in a drain of said PFET.

11. The method of claim 7 where said wide transistor is a NFET further comprising;
    epitaxially growing SiC in a drain of said NFET.

12. The method of claim 7, wherein said first gate is floating.

13. The method of claim 7, wherein said first gate is connected to a fixed voltage node.

14. The method of claim 7, wherein said first gate is connected to a signal node.

15. The method of claim 7, further comprising forming a first dummy gate over an outer edge of the first portion of the active geometry and a second dummy gate over an outer edge of the second portion of said active geometry.

16. The method of claim 15, wherein the first gate, the second gate, the first dummy gate, and the second dummy gate are disposed on a constant pitch.

* * * * *